(12) United States Patent
Bogart et al.

(10) Patent No.: US 7,141,146 B2
(45) Date of Patent: Nov. 28, 2006

(54) MEANS TO IMPROVE CENTER TO EDGE UNIFORMITY OF ELECTROCHEMICAL MECHANICAL PROCESSING OF WORKPIECE SURFACE

(75) Inventors: Jeffrey Bogart, Los Gatos, CA (US); Bulent M. Basol, Manhattan Beach, CA (US)

(73) Assignee: ASM Nutool, Inc., Phoenix, AZ (US)

( * ) Notice: Subject to any disclaimer, the term of this patent is extended or adjusted under 35 U.S.C. 154(b) by 0 days.

(21) Appl. No.: 10/816,340

(22) Filed: Mar. 31, 2004

(65) Prior Publication Data

US 2004/0266193 A1 Dec. 30, 2004

Related U.S. Application Data

(60) Provisional application No. 60/462,919, filed on Apr. 14, 2003.

(51) Int. Cl.
 *C25F 3/16* (2006.01)
 *B23H 5/06* (2006.01)
 *C25F 3/30* (2006.01)

(52) U.S. Cl. ........................... 204/199; 204/242

(58) Field of Classification Search ........... 204/224 M; 205/93, 662, 663; 451/259, 270, 271, 283
See application file for complete search history.

(56) References Cited

U.S. PATENT DOCUMENTS

| | | |
|---|---|---|
| 1,739,657 A | 12/1929 | Shemitz |
| 1,758,682 A | 5/1930 | Batenburg et al. |
| 2,540,602 A | 2/1951 | Thomas et al. |
| 3,328,273 A | 6/1967 | Creutz et al. |
| 4,140,598 A | 2/1979 | Kimoto et al. |
| 4,430,173 A | 2/1984 | Boudot et al. |
| 4,522,698 A * | 6/1985 | Maget ..................... 204/265 |
| 4,948,474 A | 8/1990 | Miljkovic |
| 4,954,142 A | 9/1990 | Carr et al. |
| 4,975,159 A | 12/1990 | Dahms |
| 5,084,071 A | 1/1992 | Nenadic et al. |
| 5,256,565 A | 10/1993 | Bernhardt et al. |
| 5,354,490 A | 10/1994 | Yu et al. |
| 5,516,412 A | 5/1996 | Andricacos et al. |
| 5,543,032 A | 8/1996 | Datta et al. |
| 5,558,568 A | 9/1996 | Talieh et al. |
| 5,681,215 A | 10/1997 | Sherwood et al. |
| 5,755,859 A | 5/1998 | Brusic et al. |

(Continued)

FOREIGN PATENT DOCUMENTS

DE 43 24 330 A1 2/1994

(Continued)

OTHER PUBLICATIONS

Chinese Office Action dated Jun. 25, 2004, with English Translation.

(Continued)

*Primary Examiner*—Harry D Wilkins, III
(74) *Attorney, Agent, or Firm*—Knobbe Martens Olson & Bear LLP (57) ABSTRACT

An electrochemical mechanical process for electroplating or electropolishing a conductive surface of a wafer is provided. The conductive surface of the wafer is touched by a polishing surface of a compressible pad while a process solution flows through the pad and a potential difference is maintained between the conductive surface and an electrode. The pressure between the polishing surface and a central region of the conductive surface is increased by applying a shaping process to either the conductive surface or the pad.

8 Claims, 8 Drawing Sheets

U.S. PATENT DOCUMENTS

| | | | |
|---|---|---|---|
| 5,762,544 A | 6/1998 | Zuniga et al. | |
| 5,770,095 A | 6/1998 | Sasaki et al. | |
| 5,773,364 A | 6/1998 | Farkas et al. | |
| 5,793,272 A | 8/1998 | Burghartz et al. | |
| 5,795,215 A | 8/1998 | Guthrie et al. | |
| 5,807,165 A | 9/1998 | Uzoh et al. | |
| 5,816,900 A * | 10/1998 | Nagahara et al. | 451/285 |
| 5,840,629 A | 11/1998 | Carpio | |
| 5,858,813 A | 1/1999 | Scherber et al. | |
| 5,876,271 A * | 3/1999 | Oliver | 451/60 |
| 5,884,990 A | 3/1999 | Burghartz et al. | |
| 5,897,375 A | 4/1999 | Watts et al. | |
| 5,911,619 A | 6/1999 | Uzoh et al. | |
| 5,922,091 A | 7/1999 | Tsai et al. | |
| 5,930,669 A | 7/1999 | Uzoh | |
| 5,931,719 A * | 8/1999 | Nagahara et al. | 451/41 |
| 5,933,753 A | 8/1999 | Simon et al. | |
| 5,954,997 A | 9/1999 | Kaufman et al. | |
| 5,985,123 A | 11/1999 | Koon | |
| 6,004,880 A * | 12/1999 | Liu et al. | 438/692 |
| 6,027,631 A | 2/2000 | Broadbent | |
| 6,063,506 A | 5/2000 | Andricacos et al. | |
| 6,066,030 A | 5/2000 | Uzoh | |
| 6,071,388 A | 6/2000 | Uzoh | |
| 6,074,544 A | 6/2000 | Reid et al. | |
| 6,103,085 A | 8/2000 | Woo et al. | |
| 6,132,587 A | 10/2000 | Jorne et al. | |
| 6,136,163 A | 10/2000 | Cheung et al. | |
| 6,176,992 B1 | 1/2001 | Talieh | |
| 6,217,426 B1 | 4/2001 | Tolles et al. | |
| 6,261,433 B1 * | 7/2001 | Landau | 205/96 |

FOREIGN PATENT DOCUMENTS

| | | |
|---|---|---|
| EP | 0 706 857 A1 | 4/1996 |
| WO | WO 98/27585 | 6/1998 |
| WO | WO 00/26443 | 5/2000 |

OTHER PUBLICATIONS

Mikkola et al.,"Investigation of the roles of the additive components for second generation copper electroplating chemistries used for advanced Interconnect metallization," *2000 IEEE*, Jun. 2000, pp. 117-119, IEEE Electron Devices Society.

Steigerwald, et al., "Chemical mechanical planarization of microelectronic materials," 1997, pp. 212-222, A. Wiley-Interscience Publication, by John Wiley & Sons, month not available.

* cited by examiner

MEANS TO IMPROVE CENTER TO EDGE UNIFORMITY OF ELECTROCHEMICAL MECHANICAL PROCESSING OF WORKPIECE SURFACE

RELATED APPLICATIONS

This application claims priority from Provisional Patent Application Ser. No. 60/462,919 filed on Apr. 14, 2003 (NT-295 P).

This application is also related to U.S. patent application Ser. No. 09/511,278 filed Feb. 23, 2000 (NT-102) which is now U.S. Pat. No. 6,413,388, the disclosure of which is incorporated herein by reference.

FIELD

The present invention generally relates to semiconductor integrated circuit technology and, more particularly, to a device for electrotreating or electrochemically processing a workpiece.

BACKGROUND

Conventional semiconductor devices such as integrated circuits (IC) generally comprise a semiconductor substrate, usually a silicon substrate, and a plurality of conductive material layers separated by insulating material layers. Conductive material layers, or interconnects, form the wiring network of the integrated circuit. Each conductor in the wiring network is isolated from the neighboring conductors by the insulating layers, also known as interlayer dielectrics. One dielectric material that is commonly used in silicon integrated circuits is silicon dioxide, although there is now a trend to replace at least some of the standard dense silicon dioxide material in IC structures with low-k dielectric materials such as organic, inorganic, spin-on and CVD candidates.

Conventionally, IC interconnects are formed by filling a conductor such as copper in features or cavities etched into the dielectric interlayers by a metallization process. Copper is becoming the preferred conductor for interconnect applications because of its low electrical resistance and good electromigration property. The preferred method of copper metallization process is electroplating. In an integrated circuit, multiple levels of interconnect networks laterally extend with respect to the substrate surface. Interconnects formed in sequential layers can be electrically connected using features such as vias or contacts. In a typical interconnect fabrication process; first an insulating layer is formed on the semiconductor substrate, patterning and etching processes are then performed to form features or cavities such as trenches, vias, and pads etc., in the insulating layer. Then, copper is electroplated to fill all the features. In such electroplating processes, the wafer is placed on a wafer carrier and a cathodic (−) voltage with respect to an electrode is applied to the wafer surface while a deposition electrolyte wets both the wafer surface and the electrode.

Once the plating is over, a material removal step such as a chemical mechanical polishing (CMP) process step is conducted to remove the excess copper layer, which is also called copper overburden, from the top surfaces (also called the field region) of the workpiece leaving copper only in the features. An additional material removal step is then employed to remove the other conductive layers such as the barrier/glue layers that are on the field region. Fabrication in this manner results in copper deposits within features that are physically as well as electrically isolated from each other. Another important material removal technique, especially for wafers with low-k dielectrics, is the electrochemical polishing (electropolishing) or electrochemical etching process. In electropolishing, an anodic voltage is applied to the wafer surface with respect to a cathodic electrode in an electropolishing electrolyte. Excess conductor, such as overburden copper is removed without physically touching and stressing the interconnect structure. It is possible to perform electropolishing on a wafer surface while physically touching the surface with a pad material. Such techniques are called electrochemical mechanical polishing or etching methods.

Some of the adverse effects of conventional material removal technologies may be minimized or overcome by employing a planar deposition approach that has the ability to provide layers of planar conductive material on the workpiece surface, as well as planar removal processes. These planar deposition and removal processes also have application in thru-resist processes employed in IC packaging. In these applications plating is performed into holes opened in resist layers onto seed films exposed on the bottom of each hole or opening.

One technique used for planar deposition and removal of materials is collectively referred to as Electrochemical Mechanical Processing (ECMPR), which term is used to include Electrochemical Mechanical Deposition (ECMD) processes as well as Electrochemical Mechanical polishing (ECMP) which is also called Electrochemical Mechanical Etching (ECME). It should be noted that in general both ECMD and ECMP processes are referred to as electrochemical mechanical processing (ECMPR) since both involve electrochemical processes and physical touching to, or mechanical action on the workpiece surface. All electrochemical techniques for material deposition and removal may be referred to as "electrotreatment."

In one aspect of an ECMPR method, a workpiece-surface-influencing-device (WSID) such as a mask, pad or a sweeper is used during at least a portion of the electrotreatment process when there is physical contact or close proximity and relative motion between the workpiece surface and the WSID. Descriptions of various planar deposition and planar etching methods and apparatus can be found in the following patents and pending applications, all commonly owned by the assignee of the present invention. U.S. Pat. No. 6,176,992 entitled "Method and Apparatus for Electrochemical Mechanical Deposition." U.S. Pat. No. 6,534,116 entitled "Plating Method and Apparatus that Creates a Differential Between Additive Disposed on a Top Surface and a Cavity Surface of a Workpiece Using an External Influence," filed on Dec. 18, 2001, and patent application Ser. No. 09/961,193 filed on Sep. 20, 2001, entitled "Plating Method and Apparatus for Controlling Deposition on Predetermined Portions of a Workpiece". These methods can deposit metals in and over cavity sections on a workpiece in a planar manner. They also have the capability of yielding novel structures with excess amount of metals over the features irrespective of their size, if desired.

In ECMD methods, the surface of the workpiece is wetted by the electrolyte and is rendered cathodic with respect to an electrode, which is also wetted by the electrolyte. During ECMD, the wafer surface is pushed against or in close proximity to the surface of the WSID or vice versa when relative motion between the surface of the workpiece and the WSID results in sweeping of the workpiece surface. Planar deposition is achieved due to this sweeping action as described in the above-cited patent applications.

In ECMP methods, the surface of the workpiece is wetted by the electropolishing electrolyte or etching solution, but the polarity of the applied voltage is reversed, thus rendering the workpiece surface more anodic compared to the electrode. A WSID touches the surface during removal of the layer from the workpiece surface.

Very thin planar films can be obtained by first depositing a planar layer using an ECMD technique and then applying an ECMP technique on the planar film in the same electrolyte by reversing the applied voltage. Alternately the ECMP step can be carried out in a separate machine and a different etching electrolyte or electropolishing solution. This way the thickness of the deposit may be reduced in a planar manner. In fact, an ECMP technique may be continued until all the metal on the field regions is removed. It should be noted that a WSID may or may not be used during the electroetching process since substantially planar etching can be achieved either way as long as the starting layer surface is planar.

Figure 1:
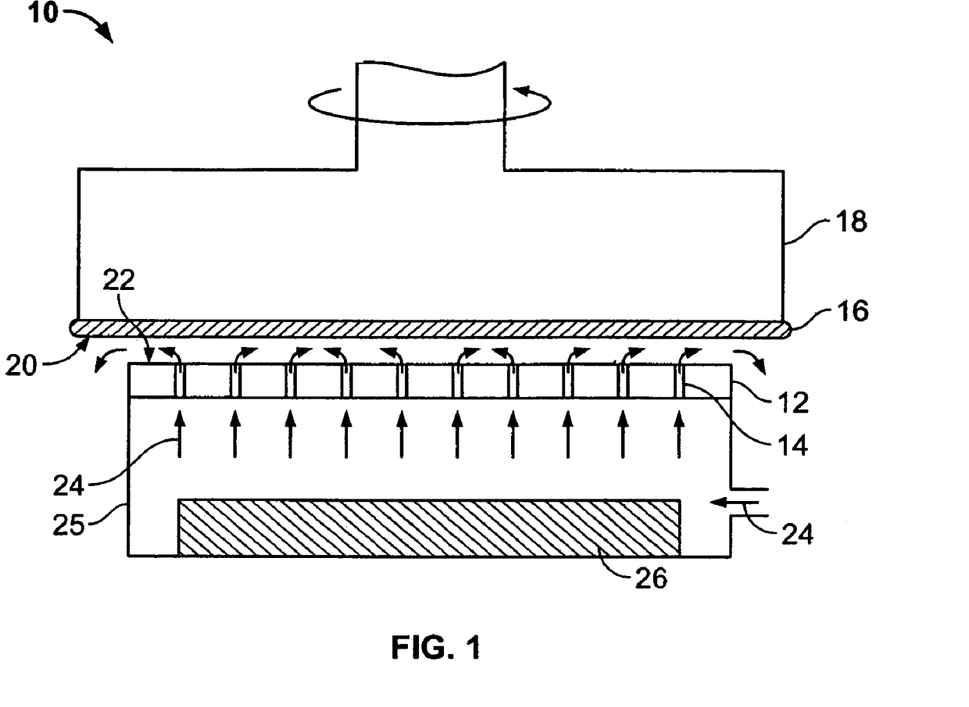
FIG. 1 is a schematic illustration of an exemplary conventional electrochemical mechanical processing system.

FIG. 1 is a schematic illustration of an exemplary conventional ECMPR system 10 used for processing wafers. In FIG. 1, a WSID 12 having openings 14 in it, is disposed in close proximity of a workpiece or wafer 16 to be processed. The wafer 16 is a silicon wafer to be plated with a conductor metal, preferably copper or copper alloy. The wafer may or may not have a previously plated copper layer on it. The wafer 16 is retained by a wafer carrier 18 so as to position front surface 20 of the wafer against top surface 22 of the WSID 12. The openings 14 are designed to assure uniform deposition of copper from an electrolyte solution 24, depicted by arrows, onto the front surface 22, or uniform electropolishing from the front surface 22. The top surface 22 of the WSID 12 facing the front surface 20 of the wafer is used as the sweeper and the WSID 12 itself establishes appropriate electrolyte flow and electric field flow to the front surface 22 for globally uniform deposition or electroetching. Such an ECMPR system 10 also includes an electrode 26, which is immersed in the electrolyte 24. The electrolyte solution 24 is contained in a process chamber 25. The electrolyte 24 is in fluid communication with the electrode 26 and the front surface 20 of the wafer 16 through the openings 14 in the WSID 12.

It should be noted that the electrode 26 is only schematically shown in FIG. 1. In actual practice, the electrodes are shielded with a particle filter and other precautions are taken to avoid bubble accumulation under the WSID and to avoid particles generated on the electrode 26 to reach the surface of the wafer 16. An exemplary copper electrolyte may be copper sulfate solution with additives such as accelerators, suppressors, leveler, chloride and such, which are commonly used in the industry. The top surface 22 of the WSID 12 sweeps the front surface 20 the wafer while an electrical potential is established between the electrode 26 and the front surface 20 of the wafer. For deposition of a planar film such as copper, the front surface of the wafer 12 is made more cathodic (negative) compared to the electrode 26, which becomes the anode. For electropolishing in the same system the wafer surface is made more anodic than the electrode.

U.S. application Ser. No. 09/960,236 filed on Sep. 20, 2001, entitled "Mask Plate Design," assigned to the assignee of the present invention, discloses various WSID embodiments. Also, U.S. application Ser. No. 10/155,828 filed on May 23, 2002, entitled Low Force Electrochemical Mechanical Deposition Method and Apparatus, also assigned to the same assignee of the present invention teaches means of applying force to the wafer surface by a WSID for ECMPR.

To this end, however, while these techniques assist in obtaining planar metal deposits or novel metal structures on workpieces and wafers, and other means of planar removal of materials from the wafer surfaces, there is still a need for further development of high-throughput approaches and apparatus that can yield deposits with better uniformity and high yield, and methods and apparatus that provide more uniform material removal from workpiece surfaces.

SUMMARY

Present invention uniformly planarizes a conductive surface on a workpiece during an electroplating or electropolishing process. Specifically, in electrochemical mechanical processing (ECMPR) such as electrochemical mechanical deposition (ECMD) and electrochemical mechanical polishing (ECMP) or electrochemical mechanical etching (ECME), since the mechanical action applied on the conductive surface on the wafer assists planarization of the conductive surface, uniformity of the applied mechanical action results in uniformly planarized conductive surfaces.

In one aspect of the present invention, a method of electrochemical mechanical processing of a conductive face of a wafer is provided. The method uses a process solution, an electrode and a compressible pad having a polishing surface and a backside. The conductive face is touched with the polishing surface of the compressible pad and the pressure between the polishing surface and the conductive face near the center of the conductive face is increased. The conductive face is processed while maintaining a potential difference and a relative motion between the conductive face.

In another aspect of the present invention, a system for electrochemical mechanical processing of a conductive face of a wafer using a process solution is provided. The system includes a compressible pad having a polishing surface, a shaping mechanism, and an electrode for applying a potential difference between the electrode and the conductive face as both the conductive face and the electrode are wetted by the process solution. The shaping pad is configured to push the conductive face against the polishing surface with more force at the center of the conductive face than the rest of the conductive face.

In another aspect of the present invention, a system for electrochemical mechanical processing of a conductive face of a wafer using a process solution is provided. The system includes a wafer carrier holding the wafer, a solution chamber, which has an upper opening, to hold the process solution, and a compressible and flexible pad having a polishing surface and fluid channels. The compressible and flexible pad is placed between the upper opening of the solution chamber and the conductive face of the wafer. The compressible and flexible pad is configured to bow and apply more pressure near the center of the conductive face than the rest of the conductive face as the pressure of the process solution in the solution chamber increases.

In another aspect of the present invention, a system for electrochemical mechanical processing of a conductive face of a wafer using a process solution is provided. The system includes a wafer carrier holding the wafer, a solution chamber to hold the process solution, the solution chamber having an upper opening defined by extendable side walls and a compressible pad. The compressible pad includes a polishing surface and fluid openings and the compressible pad is placed between the upper opening of the solution chamber and the conductive face of the wafer. As the pressure of the process solution increases extendable side walls of the process chamber push the polishing surface against the conductive face and apply uniform pressure on the conductive face.

In another aspect of the present invention, a method of electrochemical processing of a conductive face of a wafer is provided. The method uses a process solution, an electrode and a plate, which is flexible and having channels. The process solution is flowed through the channels and the flow of solution results in shaping the plate into a convex shape having a top region. A central region of the conductive face is wetted with the process solution flowing from the top region of the plate before wetting the rest of the conductive face. The conductive face is processed while maintaining a potential difference between the conductive face and the electrode.

In another aspect of the present invention, a method of electrochemical mechanical processing of a conductive face of a wafer is provided. The method uses a process solution, an electrode and a pad which is flexible and compressible and having channels extending between a polishing surface and a back surface. The polishing surface is touched with the conductive face and the process solution is flowed through the channels. The flow of solution results in shaping the pad into a convex shape so that the polishing surface presses near the center of the conductive face with more force than the rest of the conductive face. Flowing the solution through the channels applies a pressure onto the back surface of the pad. The conductive face is processed while maintaining a potential difference between the conductive face and the electrode.

These and other features and advantages of the present invention will be described below with reference to the associated drawings.

BRIEF DESCRIPTION OF THE DRAWINGS

FIGS. 12A–14B are schematic illustrations of various thickness plates having varying thickness and resulting degrees of bowing under the applied pressure;

DETAILED DESCRIPTION

The preferred embodiments will now be described using the example of fabricating interconnects for integrated circuit applications. It should, however, be recognized that present invention can be used to operate on any workpiece with various electroplated materials such as Au, Ag, Ni, Pt, Pd, Fe, Sn, Cr, Pb, Zn, Co and their alloys with each other or other materials, for many different applications such as packaging, flat panel displays, magnetic heads and such. In the examples provided below, the example material that is electroplated or electropolished will be copper, but it will be understood that other materials can instead be used.

In electrochemical mechanical processing (ECMPR) such as electrochemical mechanical deposition (ECMD) and electrochemical mechanical polishing (ECMP) or etching (ECME), since the mechanical action on wafer surface assists planarization of the surface of the wafer, uniformity of this mechanical action is important to obtain uniform process results, such as uniformly planarized wafer surface.

Figure 2:
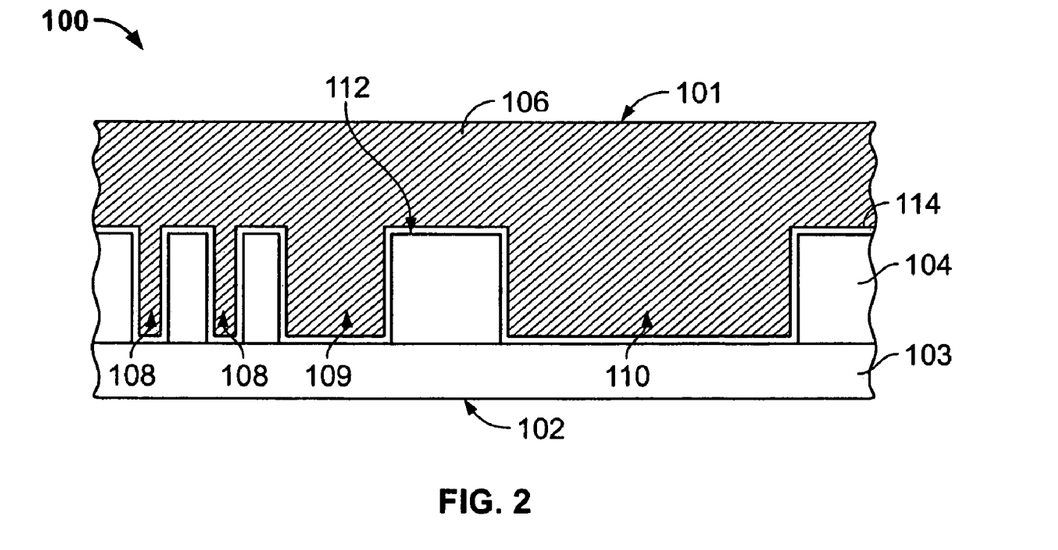
FIG. 2 is an exemplary portion of a wafer surface with a planar conductive layer.

FIG. 2 shows an exemplary portion of a workpiece 100 or a wafer having a front and a back surface 101 and 102. The wafer 100 comprises a semiconductor substrate 103 and an insulation or dielectric layer 104 on which a planar conductive layer 106 such as a planar copper layer is formed in accordance with the process of the present invention. The copper layer 106 maintains a uniform overburden thickness over the entire wafer surface. The copper layer 106 is plated to fill features in the dielectric layer using an ECMD process. Further, in an exemplary process the copper layer 106 may be electropolished using ECMP. Before the plating process, the dielectric layer 104 is processed to form features such as vias 108 and trenches 109 and 110. The features 108, 109 and 110 and top surface 112 of the dielectric layer, which is often referred to as field region or surface, are lined with one or more conductive layers such as a barrier layer 114 and a copper seed layer (not shown) before forming the copper layer 106. Interconnects are formed when the copper layer 106 is removed down to the level of field regions 112 and the barrier layer covering the field regions is also removed. Over all efficiency of this process depends on the thickness uniformity of the copper layer 106 over the entire wafer surface. As will be described more fully below, the present invention provides a method of forming a planar conductive layer while maintaining its thickness uniformity.

During ECMD and ECMP processes, wafers are typically rotated and may be moved laterally. As can be appreciated, on a rotating wafer surface the linear velocity due to rotation is zero right at the center of the wafer and it increases linearly towards the edge of the wafer in proportion to the distance to the center. The linear velocity is highest right at the edge of the wafer and it is given by the relationship: $V=(2\pi R/60)$ cm/second, where "r" is the radius of the wafer in centimeters and "R" is the rotation in revolution per minute (rpm). As can be seen from this relationship, velocity "V" increases as the radius of the wafer "r" increases. Mechanical action delivered by a WSID (see FIG. 1) onto wafer surface increases with the relative velocity between the WSID and wafer surface as well as the force applied onto the surface by the WSID. Therefore, in an electrochemical mechanical process, in one method, the uniformity of the mechanical action on the wafer surface may be improved by keeping the relative velocity between the WSID and the whole wafer surface substantially the same while keeping the force applied by the WSID onto the wafer surface substantially constant. An example of this method can be found in U.S. patent application Ser. No. 10/288,558, entitled Electrochemical Mechanical Deposition with Advancible Sweeper, filed Nov. 4, 2002. In that application, a belt type WSID is used for ECMD and ECMP processes. The belt WSID or the wafer may be moved linearly. The high linear velocity of the belt WSID is constant everywhere on the wafer surface as long as the velocity on the wafer surface due to rpm is much lower than the linear velocity of the belt WSID. For example, if the wafer is rotated with 5 rpm and belt linear velocity is 100 cm/sec, the linear velocity at the edge of the wafer due to rpm would be about 5 cm/sec for an 8" wafer. This is negligible compared to the belt speed of 100 cm/sec.

In another method, if the relative velocity between the WSID and the wafer surface is not constant, the force applied by the WSID is adjusted such that a higher force is applied onto certain surface regions, such as the central region of the wafer, where the relative velocity is low. As previously mentioned, in exemplary ECMD or ECMP processes, the wafer is rotated and also translated over a stationary WSID surface. If the velocity of the lateral motion is lower than the motion near the edge of the wafer due to rotation, velocity near the center of the wafer would be lower than at the edge. Therefore, additional force needs to be applied near the center of the wafer to improve process results.

Figure 3:
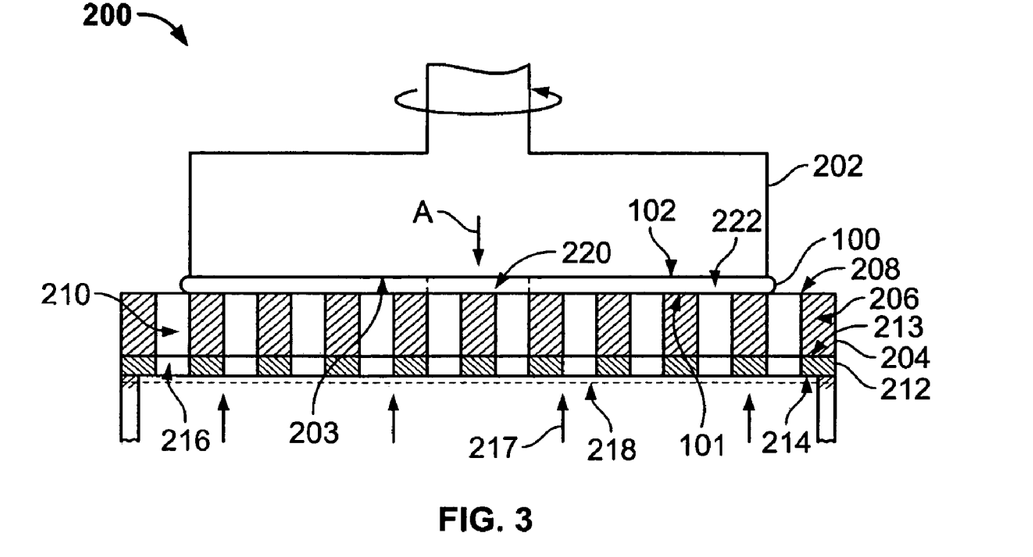
FIG. 3 is a schematic illustration of an electrochemical mechanical processing system of the present invention where a force is applied to the back surface of the wafer.

There are various approaches that may be used to apply additional force on the wafer surface near its center. One such approach involves shaping of the wafer surface. When such shaped wafer surface is pushed against a pad structure, its center gets the highest force. An example of shaping wafer 100 while it is processed may be described in connection with FIG. 3, which illustrates a partial view of an ECMPR system 200. In FIG. 3, only components such as a wafer carrier 202 and a WSID 204 of the system 200 are illustrated for the purpose of clarity. The wafer carrier holds the wafer 100 by the back surface 102 while exposing the front surface 101 of the wafer to the WSID 204. The wafer is held on a chuck face 203 of the wafer carrier.

The WSID 204 may have a compressible layer 206 having a top surface 208. The top surface 208 may be made of a flexible material and may be abrasive or it may contain a polishing pad material. The top surface 208 is brought to physical contact with the front surface 101 of the wafer during the ECMD or ECMP processes. The WSID 204 comprises openings 210, such as holes with various geometrical shapes or slits with varying width, or may be made of a porous material that allows a process solution (not shown) to flow through the WSID and wet the surface of the wafer. The WSID 204 is supported by a support plate 212, which has a top surface 213 and a back surface 214. The WSID 204 is placed on the top surface 213 of the support plate 212. The support plate 212 is fixed on side-walls 215 of a process chamber, which is not shown in FIG. 3 but can be seen in FIG. 1. The openings 210 may continue through the support plate as support plate openings 216, although size and location of the openings 216 may be different from the openings 210 in the WSID. For example, support plate openings 216 may be made of narrow slits or very small holes. Alternately, support plate openings 216 may be larger than openings 210. Optionally a flow restrictor such as a filter 218 may be placed under the support plate. This filter also reduces the number of particles that may reach the wafer surface. A process solution 217 in the process chamber is delivered to the front surface 101 of the wafer 100. Process solution 217 flows through the pores of the filter, openings of the support plate and the WSID to reach the front surface during the process.

Figure 4:
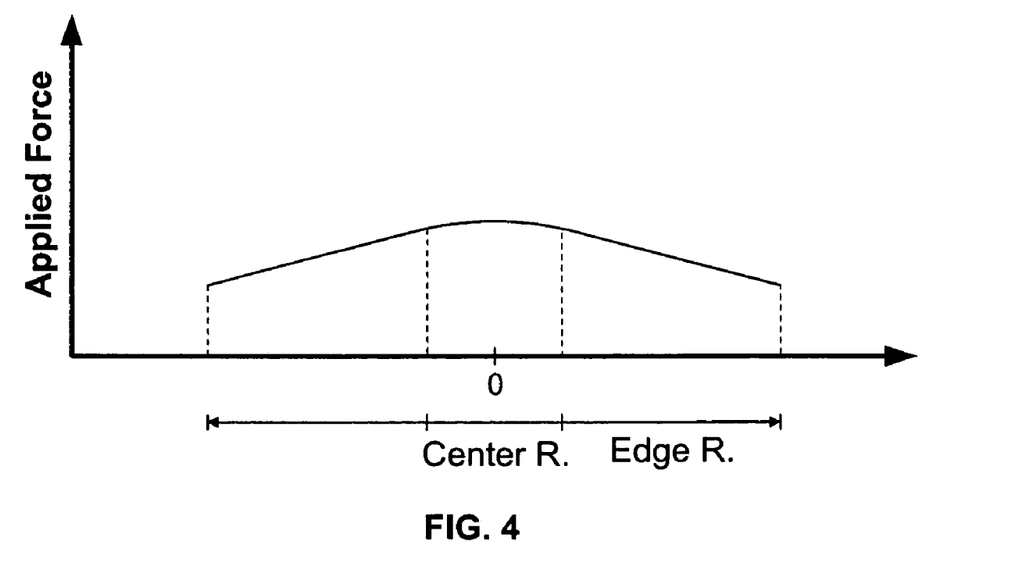
FIG. 4 is a graph showing the distribution of the applied force over the wafer surface as the force is applied in the manner shown in FIG. 3.
Figure 5:
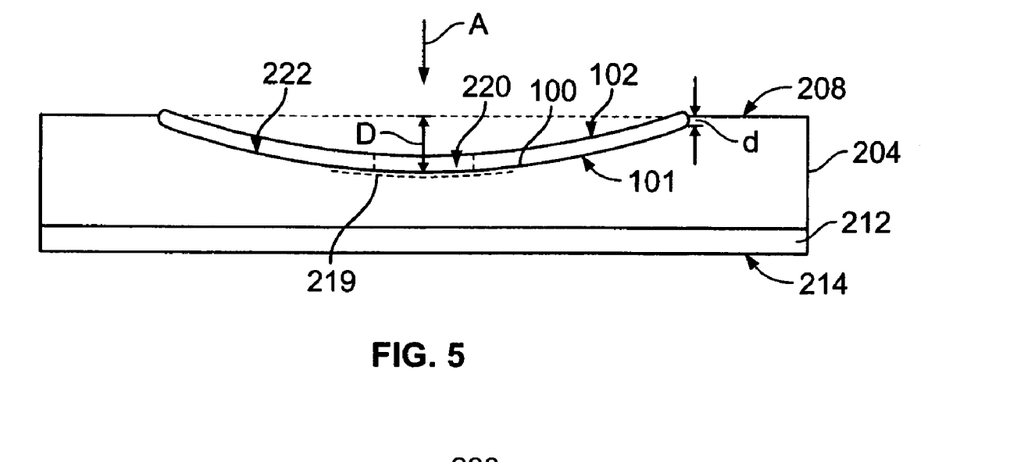
FIG. 5 is a schematic illustration of interaction between a wafer front surface and the workpiece surface influencing device as the center region of the wafer back surface is pressed against the workpiece surface influencing device.

Referring to FIGS. 3–5, shaping of the front surface 101 of the wafer 100 may be performed by applying a force to the back surface 102 of the wafer to deflect the front surface 101. As shown in FIG. 5, as the force is applied to the back surface of the wafer 100, the wafer bows into the WSID and a higher-pressure interface 219 forms between the center region 220 of the front surface of the wafer and the top surface 208 of the WSID 204. This is because the support plate 212 is relatively rigid in this example and extra compression of the compressible layer of the WSID in the central region applies higher force to the wafer surface in this region compared to the edge region. The size of the pressure interface depends on the applied force and depending on the force it may get smaller or larger. A force source in the wafer carrier 202 may apply a force to the back of the wafer and cause the wafer to bow into the WSID and thereby pushing a center region 220 of the wafer 100 in the direction of the arrow A. The force source may use a pressurized fluid, inflatable membranes, or a mechanism using shims or pins to physically apply force to the back surface 102 of the wafer. Application of the force A, gives the wafer 100 and hence the front surface 101 a convex shape which allows WSID to exert more force on the center region 220 than edge region 222 of the wafer 100. In FIG. 4, this can be seen in the force distance graph 224. As seen in the graph, the force applied to the center region is higher than the edge region of the wafer.

As shown in FIG. 5, as the force A is applied, the center region is pushed into the WSID 204 by a distance D at the center region 220 and a distance d at the edge region 222. Since the force applied by the WSID onto the wafer surface is proportional to the distance the surface is pressed into the WSID, as the D distance becomes larger than the d-distance, the force, which is applied to the center region becomes higher than the edge region. It should be understood that the distances and the convex shape of the wafer are exaggerated in figures for clarity. In practice the difference between the distance D and distance d may be in the range of 0.1–1 mm for an 8" wafer or as much as 2 mm for a 300 mm wafer. For the purpose of clarity, openings in the WSID are not shown in FIG. 5.

Figure 6A:
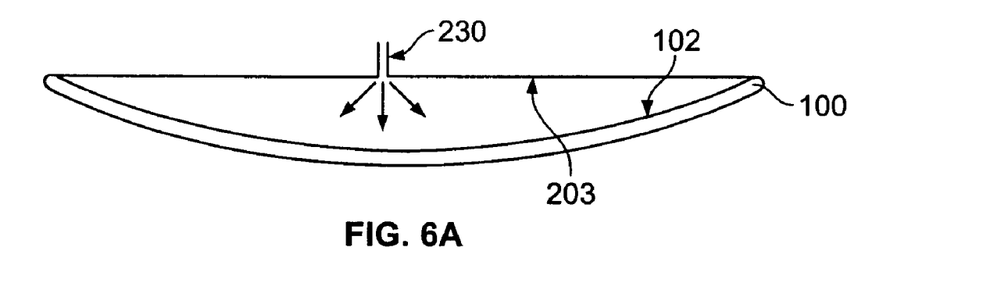
FIGS. 6A–6D are schematic illustrations of various force sources to apply force on the back surface of a wafer.
Figure 6B:
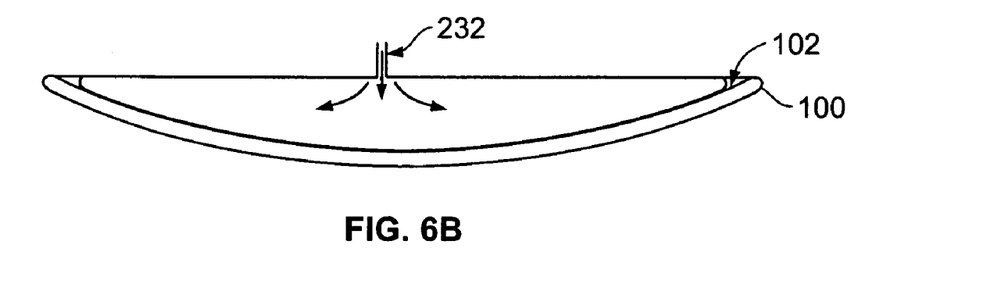
Figure 6C:
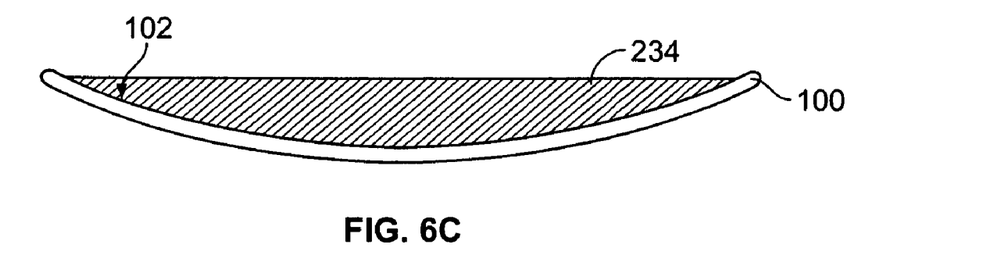
Figure 6D:
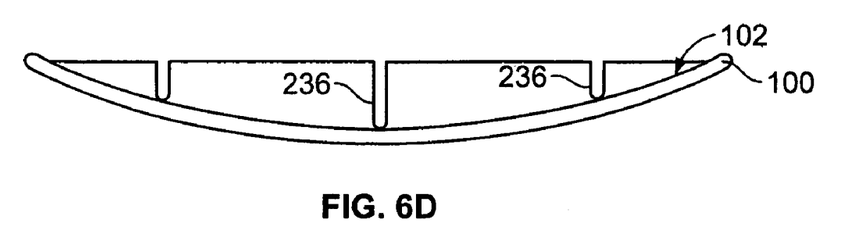

FIGS. 6A–6D illustrate various configurations of force source. In each configuration edges of the wafer is held by a holding mechanism on the wafer carrier and the force is applied on the back surface of the wafer. FIG. 6A shows a pressurized fluid source 230, preferably air to apply pressure to the back surface of the wafer. Fluid source may be in the chuck face 203 of the wafer carrier (see FIG. 3). FIG. 6B illustrates an inflatable member 232 such as a bladder to fill with pressurized air or another gas to apply pressure. The bladder may be placed between the chuck face and the back surface of the wafer, and attached to the fluid source 230. FIG. 6C shows a curved object 234, which may be placed between the back surface of the wafer and the chuck face to press against the back surface 102 of the wafer to shape it. FIG. 6D shows use of pins 236 configured to have varying length so that more force is applied to the center region on the back of the wafer. Pins may be placed in the chuck face and moved by a moving mechanism.

Figure 7:
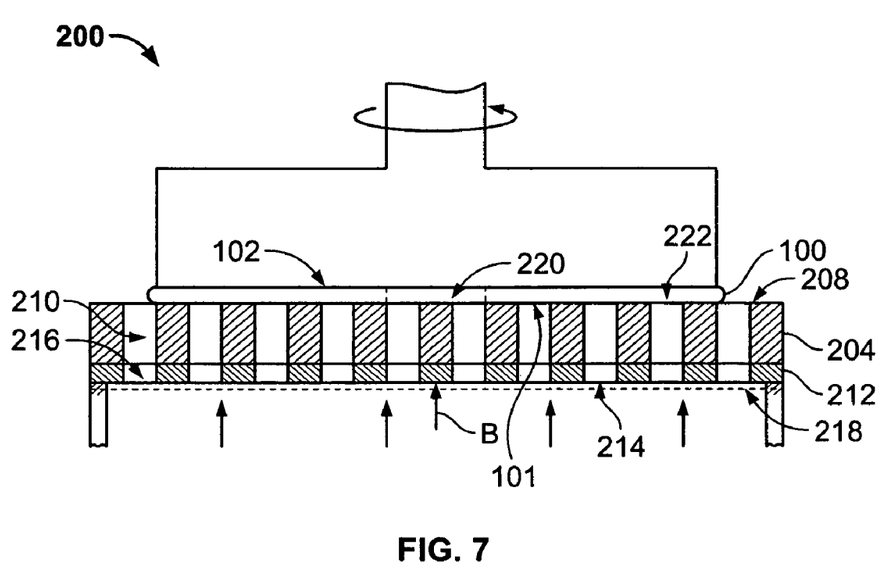
FIG. 7 is a schematic illustration of the electrochemical mechanical processing system of the present invention where a force is applied to the back surface of the workpiece surface influencing device.
Figure 8:
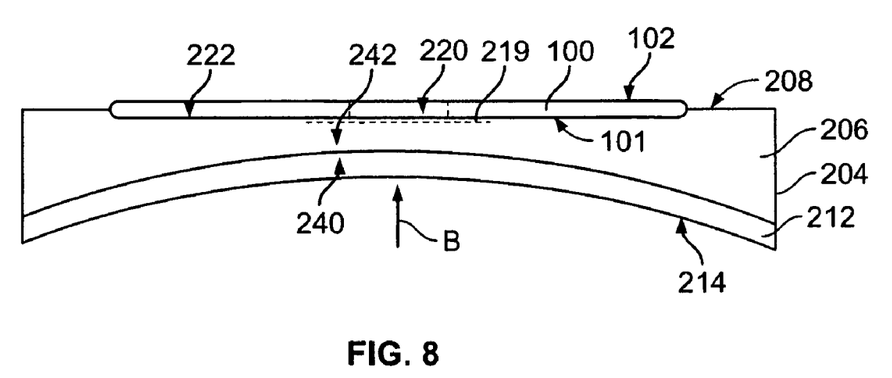
FIG. 8 is a schematic illustration of the interaction between a wafer front surface and the workpiece surface influencing device as the surface of the workpiece surface influencing device is pressed against the center region of the wafer front surface.

As shown in FIG. 7 in system 200, another method for achieving the same result involves applying force to the center region of the WSID 204 and thereby compressing a portion of the WSID more against the center region 220. As shown in FIGS. 7 and 8, since the edges of the support plate is substantially fixed on the side walls of the process chamber, by applying a force in the direction of arrow B to the back surface 214 of the support plate 212, the support plate is bowed towards the front surface 101 of the wafer. This way, selected region 240 of the support plate is brought closer to the center region 220 of the wafer 100 and forms a high-pressure interface 219. The location of the selected region 240 is configured to correspond to the center region 220 of the wafer. The bowing effect shown in FIG. 8 and other figures are highly exaggerated for the purpose of clarity. In practice, during bowing, the selected region may move up a distance only in the range of 0.1 to 2 millimeters. As the selected region of the support plate is moved closer to the center region 220 of the wafer, a portion 242 of the compressible layer 206 between the center region 220 and the selected region 240 is compressed between these two surfaces. This, in turn, pushes the top surface 208 of the WSID against the center region and applies more force to the center region 220 than the edge region 222. It should be noted that in this method a relatively flexible support plate 212 may be used. By selecting the thickness and flexibility of the support plate and the magnitude of the applied force, the degree of bowing and the magnitude of the extra force applied to the central region may be controlled.

Referring back to FIG. 7, the force maybe applied to the support plate 212 by exerting more process solution pressure to the back surface of the support plate or the filter 218 placed under it. Such pressure gives the support plate a convex shape. The pressure and thus the magnitude of the applied force may be controlled by various means such as flow restrictors, filters with varying porosity or bleed valves.

One exemplary method of controlling force involves controlling the flow rate of the process solution. Depending on the porosity of the filter 218, as the flow rate of the process solution increases, the pressure under the filter 218 increases. Since the edges of the support plate are fixed, the support plate bows up under increased process solution flow as shown in FIG. 8. It is also possible to increase or decrease the amount of bowing by keeping the flow constant but by using one or more bleed valves that can control the pressure under the filter. In this case, by controlling the amount of solution that is bled through these valves, the pressure under the filter maybe increased (when valves are closed restricting the amount of solution bleeding out through them) or decreased (when valves are opened increasing the amount of solution bleeding out through them) or kept constant at a predetermined pressure level. It should be noted that this process may be automated using feedback control as will be discussed later. For the purpose of clarity, openings in the WSID are not shown in FIG. 8.

Figure 9:
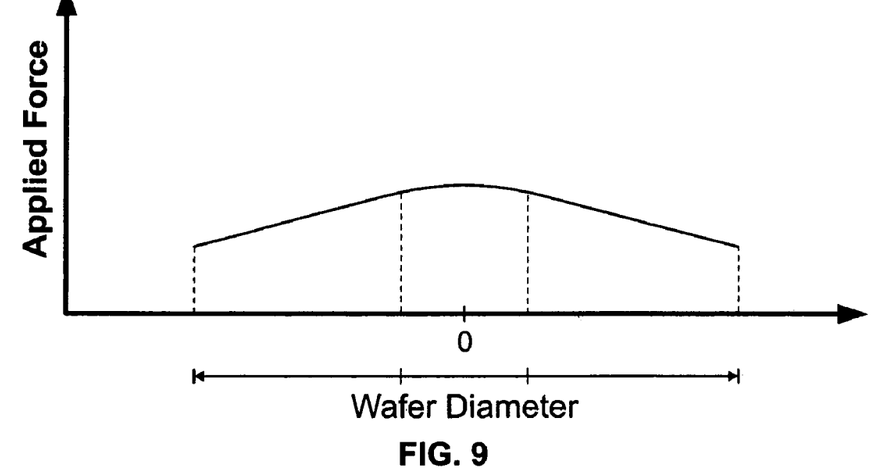
FIG. 9 is a graph showing the distribution of the applied force over the wafer surface as the force is applied in the manner shown in FIG. 8.

Another way of controlling the bowing and thus the force on the central region of the wafer involves controlling the porosity of the filter. At a given solution flow rate, filters with smaller pore size would give more bowing and thus more additional force would be applied to the central section of the wafer. As can be seen in the force-distance graph in FIG. 9, the force applied to the center 220 of the wafer is higher than the force applied to the edge 222.

Figure 10:
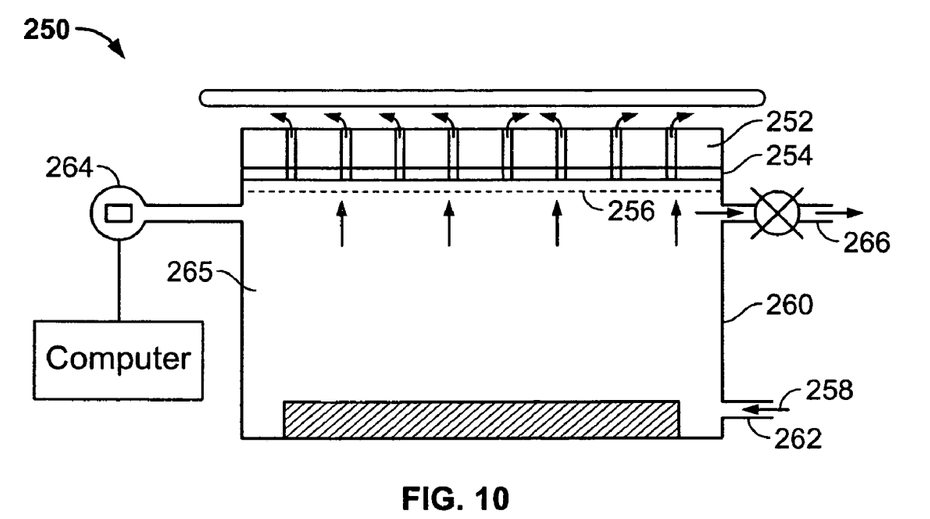
FIG. 10 is a schematic illustration of an embodiment of a smart electrochemical mechanical processing system of the present invention where a force is applied to the back surface of the workpiece surface influencing device.

FIG. 10 illustrates a smart system 250 which can sense the pressure under the filter element 256 using a transducer. The system 250 includes a WSID 252 supported by a support plate 254. A filter 256 is placed under the support plate 254. The filter 256 may not be needed if the openings in the WSID are small enough to keep the cavity 265 pressurized. However, presence of the filter is preferable since it also filters out any particulates from the process solution before delivering it to the wafer surface. Process solution 258 enters chamber 260 through an inlet 262. Differing from the previously described embodiments, a pressure-monitoring device 264 such as a pressure transducer monitors the solution pressure and, turns on and off a bleed valve 266 to keep the pressure, and hence the bowing of the support plate at a predetermined desired value. For example, if the flow is set to a constant value and the pressure in the cavity 265 is higher than the pre-determined value, the bleed valve 266 is automatically opened more to let more solution out and bring the pressure down to the pre-determined level. Similarly, if the actual pressure within cavity 265 is lower than the pre-determined value then the bleed valve 266 would automatically close to restrict flow through it and bring the pressure up to the pre-determined level. This way, using feedback and computer control a predetermined value for the pressure is selected and kept through the process. Also, by changing the pressure during the process, more or less force may be applied on the surface in a controlled manner. Bowing is a strong function of the choice of filter, flexibility of the support plate and the pressure under the support plate.

The force may also be controlled by shaping the WSID itself or by constructing the support plate to make it more or less compliant along the diameter of the wafer. Other stiffeners or flexural members can be added to WSID to produce a force curve of any desired shape for planarization, especially at the center region.

Figure 11A:
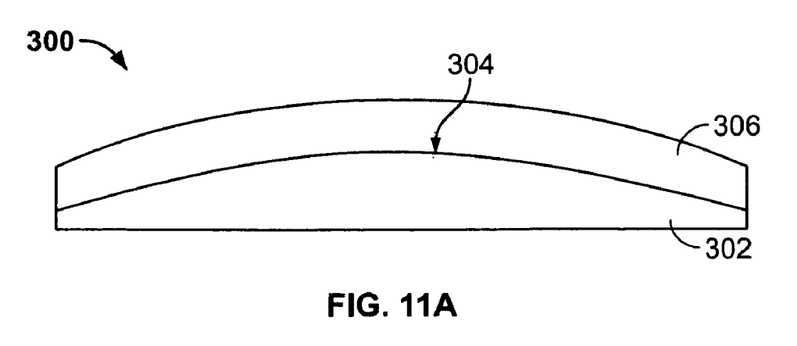
FIG. 11A–11B are schematic illustrations of various combinations of support plate and workpiece influencing device having the convex profile.
Figure 11B:
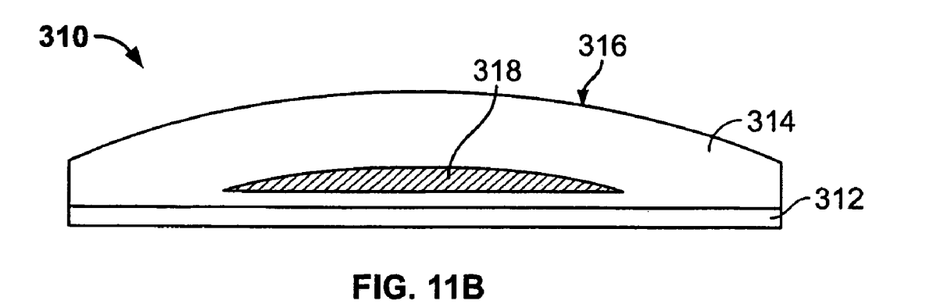

In this respect, FIGS. 11A–11B illustrate various support plate and WSID combined structures to create a bowing effect. As shown in FIG. 11A a first structure 300 includes a support plate 302 having a curved top surface 304. A WSID 306 is attached on the curved top surface 304 so that a top surface 308 of the WSID is in compliance with the curved top surface 304 of the support plate. As shown in FIG. 11B, support plate and WSID combined structure 310 has a support plate 312 and a WSID 314. In this example, a curved top surface 316 of the WSID is provided using a curved insert 318. In FIGS. 11A–11B, for the purpose of clarity openings of the support plates and the WSIDs are not shown in the figures.

Figure 12A:
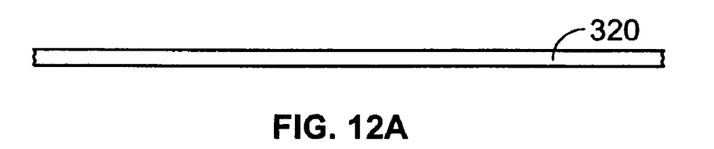
Figure 12B:
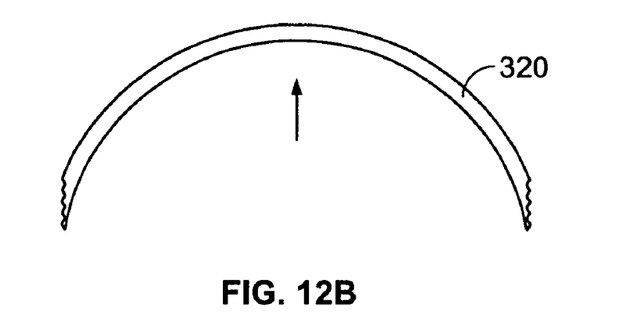

By varying the thickness of the support plate, applied pressure and the size of the high-pressure interface may be changed. FIGS. 12A–12B illustrate a support plate 320 before and after the application of the force. The support plate 320 is a thin support plate; therefore, with the applied pressure it bows more in comparison to a thicker support plate. This may allow the support plate 320 to apply more localized pressure and to a smaller area of the wafer.

Figure 13A:
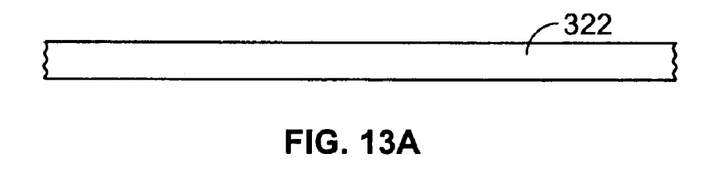
Figure 13B:
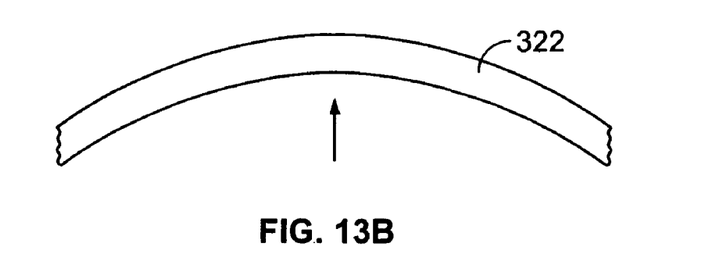

FIGS. 13A–13B show a support plate 322, which is thicker than the support plate 320 described above. Since it is thicker, the support plate bows less and thereby, it may apply a force to a larger area on the wafer.

Figure 14A:
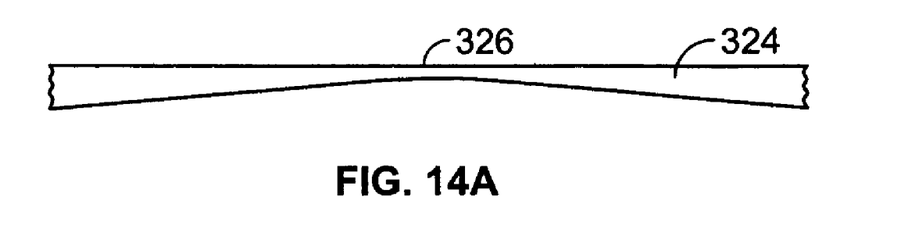
Figure 14B:
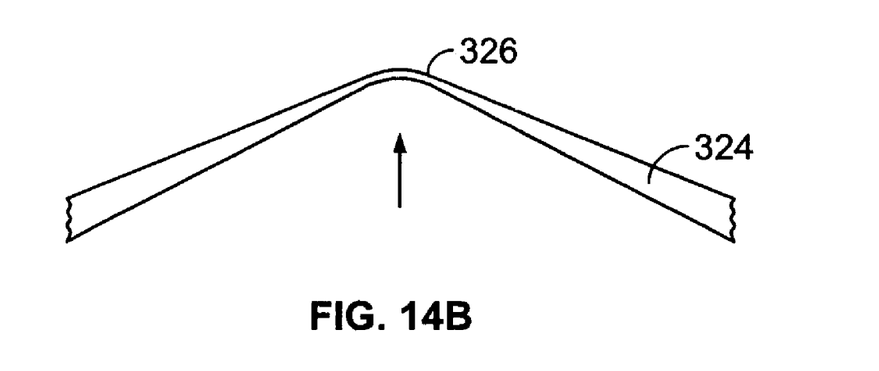

FIGS. 14A–14B illustrate a support plate 324 before and after the application of the force. The support plate 324 has a thin section 326; therefore, when a pressure is applied to the thin section, the thin section 326 protrudes more. This may allow the support plate to apply more localized pressure and to a smaller area of the wafer. Again, the bowing effects in all these drawing are greatly exaggerated to clearly explain the invention. For the purpose of clarity, openings in the support plates are not shown in FIGS. 12A–14B.

Figure 15A:
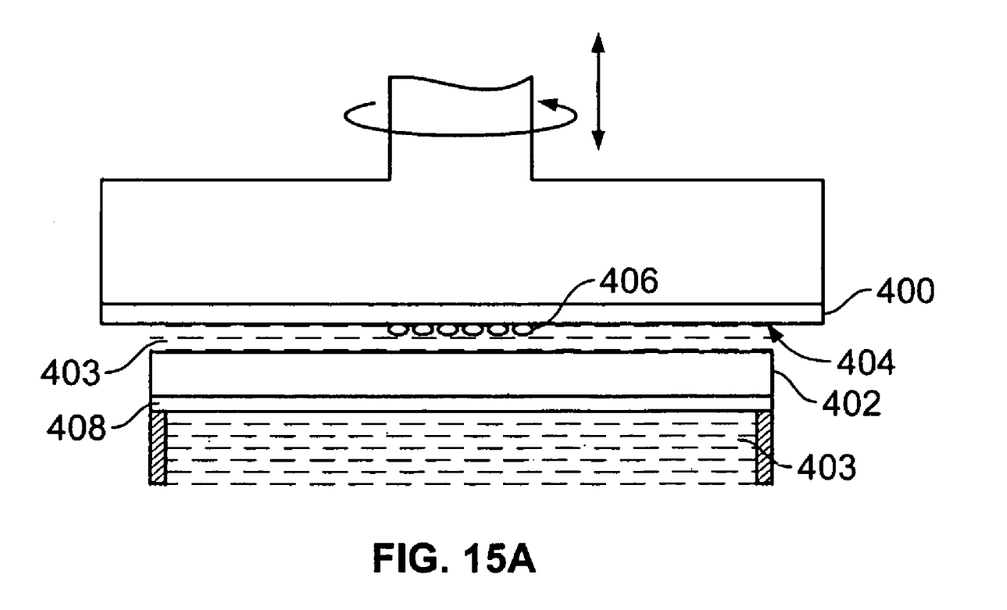
FIG. 15A–15B are schematic illustrations of removing entrapped bubbles with the present invention by bowing the WSID towards the center of a wafer during a process.
Figure 15B:
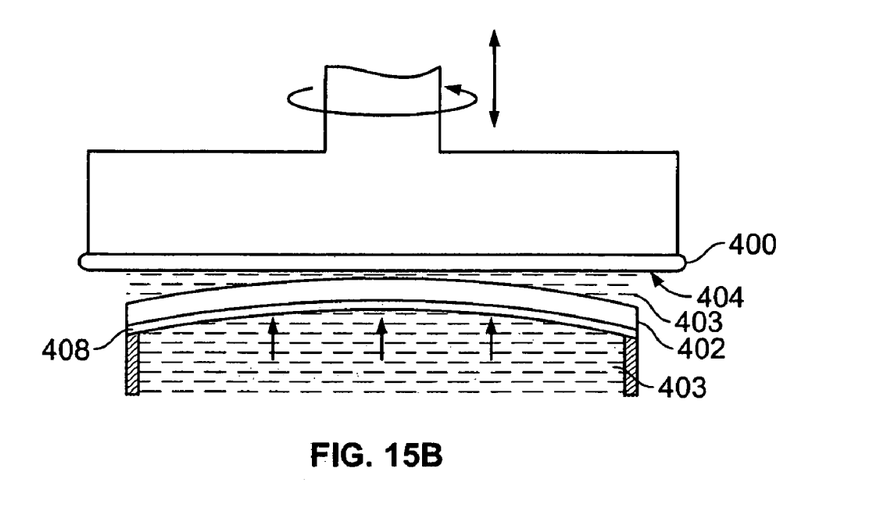

The present invention may also be used for eliminating bubbles that may be trapped between the wafer surface and the process solution during electroplating and electropolishing processes. As shown in FIG. 15A, as a wafer is first lowered towards the WSID 402 and enters the process solution 403, bubbles 406 may get trapped under the wafer surface 404, especially near the center of the wafer. This is a common problem in electroplating and electropolishing technologies and is generally due to the fact that the edges of the wafer may get wetted by the process solution before its center. If these bubbles stay on the wafer surface during the process, they may generate defects in the forming layers and therefore they must be removed. As shown in FIG. 15B, when the pressure of the solution 403 is increased to bow the support plate 408 towards the wafer 400 at least during the first stage of process when wafer is being lowered down towards WSID 402, WSID 402 bows and the solution flowing from the WSID 402 also takes a convex shape. This way when the wafer is lowered towards the WSID, the central region of the wafer gets wetted by the process solution first. Because of the convex shape of the WSID, the solution from the top of the convex shape reaches the center of the center of the conductive surface of the wafer and wets the center region before the solution flowing from the rest of the WSID reaches and wets the rest of the surface of the wafer. This way, since the bubbles are swept away from the center, no bubble entrapment occurs. For the purpose of clarity, openings in the WSID and the support plates are not shown in FIGS. 15A–15B.

Figure 16:
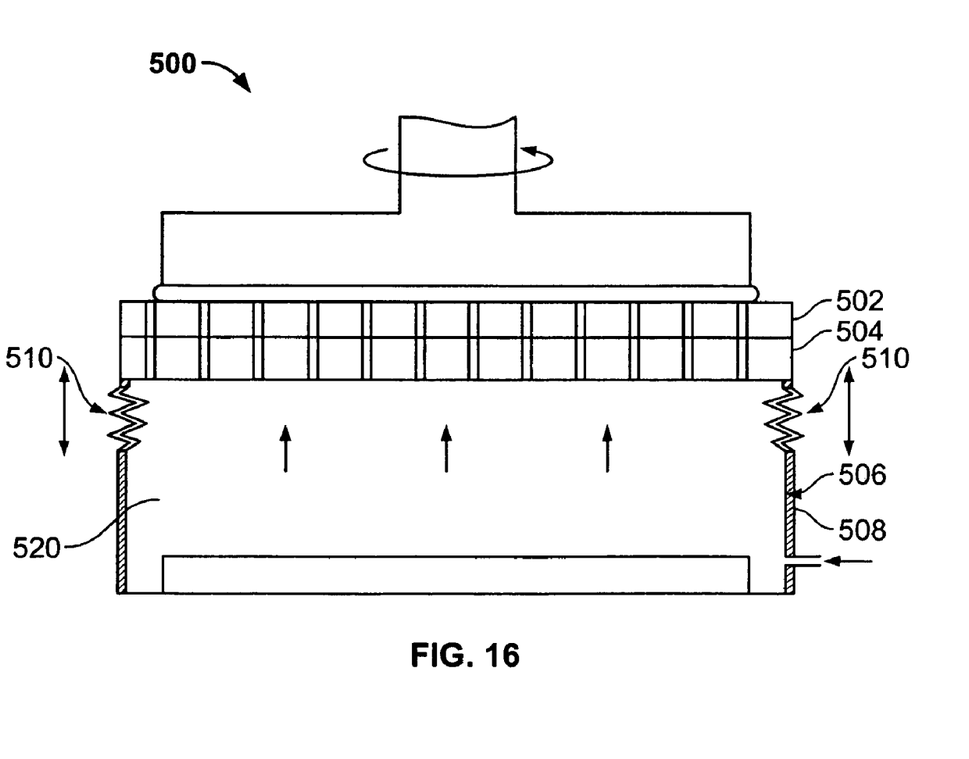
FIG. 16 is a schematic illustration of an alternative electrochemical mechanical processing system of the present invention where a uniform force is applied to the front surface of the wafer by a workpiece surface influencing device.

The present invention may also be used to apply uniform force onto the whole face of the wafer during the process. In this application, a rigid support plate can be used so that the support plate moves the entire surface of the WSID towards the wafer surface. One possible embodiment is illustrated in FIG. 16. As shown in FIG. 16, an ECMPR system 500 may include a WSID 502 attached on top of a support plate 504. Edges of the support plate 504 are attached to side walls 506 of the process chamber 508. In this embodiment, side walls comprises compressible members 510. Compressible members 510 allow support plate to move vertically up and down with the applied solution pressure in cavity 520. As the solution pressure in the chamber 508 within the cavity 520 is increased, rigid support plate moves towards the wafer surface and the surface of the WSID touches the entire surface of the wafer. The force applied to the surface of the wafer is uniform at each point on the surface of the wafer. Those skilled in the art would realize that this embodiment may be used in conjunction with all the other embodiments described so far in this application.

Although various preferred embodiments and the best mode of the present invention have been described in detail above, those skilled in the art will readily appreciate that many modifications of the exemplary embodiment are possible without materially departing from the novel teachings and advantages of this invention.

We claim:

1. A system for electrochemical mechanical processing of a conductive face of a wafer using a process solution, comprising:
    a wafer carrier holding the wafer;
    a solution chamber to hold the process solution, the solution chamber having an upper opening;
    a compressible and flexible pad, having a polishing surface and fluid channels, placed between the upper opening of the solution chamber and the conductive face of the wafer, wherein the compressible and flexible pad is configured to bow and apply more pressure near the center of the conductive face than the rest of the conductive face as the pressure of the process solution in the solution chamber increases;
    an electrode in contact with the process solution, wherein the system is configured to apply a potential difference between the conductive face of the wafer and the electrode; and
    a control system programmed to control pressure to ensure bowing the pad while relatively moving the conductive face of the wafer and the pad into contact.

2. The system of claim 1, further comprising a perforated and flexible support plate placed under the compressible and flexible pad.

3. The system of claim 1, further comprising a porous membrane placed under the compressible and flexible pad.

4. The system of claim 2, wherein a porous membrane is placed under the perforated and flexible support plate.

5. The system of claim 1, further comprising a pressure sensor placed in fluid communication with the process solution in the process solution chamber.

6. The system of claim 5, wherein the signal of the pressure sensor is fed to a solution flow controller to adjust flow rate of the process solution.

7. The system of claim 1, wherein electrochemical mechanical processing comprises electrochemical mechanical deposition.

8. The system of claim 1, wherein electrochemical mechanical processing comprises electrochemical mechanical polishing.

* * * * *